(12) United States Patent
Zhou

(10) Patent No.: US 11,424,166 B2
(45) Date of Patent: Aug. 23, 2022

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 17/218,975

(22) Filed: Mar. 31, 2021

(65) Prior Publication Data

US 2021/0327767 A1     Oct. 21, 2021

(30) Foreign Application Priority Data

Apr. 17, 2020   (CN) .......................... 202010305031.3

(51) Int. Cl.
*H01L 21/8238*     (2006.01)
*H01L 27/12*         (2006.01)
(Continued)

(52) U.S. Cl.
CPC ...... *H01L 21/823807* (2013.01); *H01L 21/84* (2013.01); *H01L 27/092* (2013.01);
(Continued)

(58) Field of Classification Search
CPC ....... H01L 21/823807; H01L 29/78696; H01L 29/42392; H01L 27/1203; H01L 27/092; H01L 21/84; H01L 21/823826
(Continued)

(56) References Cited

U.S. PATENT DOCUMENTS 9,805,988 B1 * 10/2017 Bentley et al. ............................. H01L 21/823821
257/401

* cited by examiner

*Primary Examiner* — Thinh T Nguyen
(74) *Attorney, Agent, or Firm* — Crowell & Moring, LLP

(57) ABSTRACT

A semiconductor structure and a method for forming same are provided. One form of the forming method includes: providing a base, the base including: a substrate and a channel stack on the substrate, the channel stack including a first channel layer and a second channel layer located on the first channel layer, the first channel layer and the second channel layer being made of different materials, and a first region and a second region, where the channel stack is located in the first region and the second region; forming an interlayer dielectric layer on the substrate exposed from the channel stack, where a gate opening from which the channel stack is exposed is formed in the interlayer dielectric layer; removing the second channel layer of the first region in the gate opening; removing the first channel layer of the second region in the gate opening; and forming a gate structure surrounding a remainder of the first channel layer and the second channel layer. In some implementations of the present disclosure, channel regions of transistors in the first region and the second region are made of different materials to meet performance requirements of different transistors, thereby optimizing electrical performance of the semiconductor structure.

14 Claims, 5 Drawing Sheets

(51) Int. Cl.
*H01L 29/423* (2006.01)
*H01L 21/84* (2006.01)
*H01L 27/092* (2006.01)
*H01L 29/786* (2006.01)

(52) U.S. Cl.
CPC .... *H01L 27/1203* (2013.01); *H01L 29/42392* (2013.01); *H01L 29/78696* (2013.01); *H01L 21/823828* (2013.01)

(58) Field of Classification Search
USPC .......................................... 438/199; 257/369
See application file for complete search history.

SEMICONDUCTOR STRUCTURE AND METHOD FOR FORMING SAME

RELATED APPLICATIONS

The present application claims priority to Chinese Patent Appln. No. 202010305031.3, filed Apr. 17, 2020, the entire disclosure of which is hereby incorporated by reference.

BACKGROUND

Technical Field

The present disclosure relates to the field of semiconductor manufacturing, and in particular, to a semiconductor structure and a method for forming same.

Related Art

With the rapid development of semiconductor manufacturing technologies, semiconductor devices develop has trended toward higher element density and higher integration, and a developing trend of semiconductor process nodes according to the Moore's Law continuously weakens. Transistors are currently being widely used as the most basic semiconductor devices. Therefore, as the element density and integration of the semiconductor devices increase, channel lengths of the transistors need to be continuously shortened to adapt to reduced process nodes.

In order to better meet a requirement of proportional reduction in a device size, the semiconductor process gradually transits from a planar transistor to a three-dimensional transistor with higher efficacy, such as a gate-all-around (GAA) transistor. In the gate-all-around transistor, a gate surrounds a region in which a channel is located. Compared to the planar transistor, the gate of the gate-all-around transistor has a stronger channel control capability and can better suppress a short-channel effect. The gate-all-around transistor includes a lateral gate-all-around (LGAA) transistor and a vertical gate-all-around (VGAA) transistor. A channel of the VGAA extends in a direction perpendicular to a surface of a substrate, helping improve area utilization efficiency of a semiconductor structure, thereby helping achieve further critical dimension reduction.

SUMMARY

A problem to be addressed in the embodiments and implementations of the present disclosure is to provide a semiconductor structure and a method for forming same, so as to optimize electrical performance of the semiconductor structure.

To address the foregoing problem, one form of the present disclosure provides a method for forming a semiconductor structure, including: providing a base, the base including: a substrate and a channel stack on the substrate, the channel stack including a first channel layer and a second channel layer located on the first channel layer, where the first channel layer and the second channel layer are made of different materials, and a first region and a second region, the channel stack being located in the first region and the second region; forming an interlayer dielectric layer on the substrate exposed from the channel stack, where a gate opening from which the channel stack is exposed is formed in the interlayer dielectric layer, and a top surface of the interlayer dielectric layer is higher than a top surface of the channel stack; removing the second channel layer of the first region in the gate opening; removing the first channel layer of the second region in the gate opening; after the second channel layer of the first region in the gate opening and the first channel layer of the second region in the gate opening are removed, forming a gate structure in the gate opening, the gate structure surrounding a remainder of the first channel layer and the second channel layer.

Another form of the present disclosure provides a semiconductor structure, including: a substrate including a first region and a second region; a plurality of first channel layers separated from each other and suspended on the substrate in the first region; a plurality of second channel layers separated from each other and suspended on the substrate in the second region, where the second channel layer and the first channel layer are made of different materials; and a gate structure located on the substrates in the first region and the second region surrounds the first channel layer and the second channel layer.

Compared to the prior art, technical solutions of the embodiments and implementations of the present disclosure have at least the following advantages:

In forms of the method for forming a semiconductor structure provided in the embodiments of the present disclosure, after the interlayer dielectric layer is formed, the second channel layer of the first region in the gate opening and the first channel layer of the second region in the gate opening are removed, and then a gate structure is formed in the gate opening, the gate structure surrounding the remaining first channel layer and second channel layer.

A channel region in the first region is the first channel layer, a channel region in the second region is the second channel layer, and the channel region in the first region and the channel region in the second region adopt different materials. In this way, channel regions of transistors formed in the first region and the second region are made of different materials, meeting performance requirements of different transistors, thereby optimizing the electrical performance of the semiconductor structure.

DETAILED DESCRIPTION

It may be learned from the background art that currently formed semiconductor structures still have poor performance. The reason why the semiconductor structures have poor performance is now analyzed in combination with a method for forming a semiconductor structure.

Figure 1:
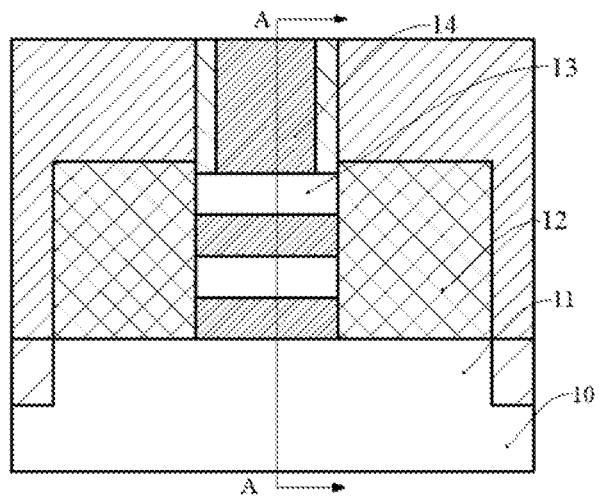
FIG. 1 and FIG. 2 are schematic structural diagrams of steps in a method for forming a semiconductor structure.
Figure 2:
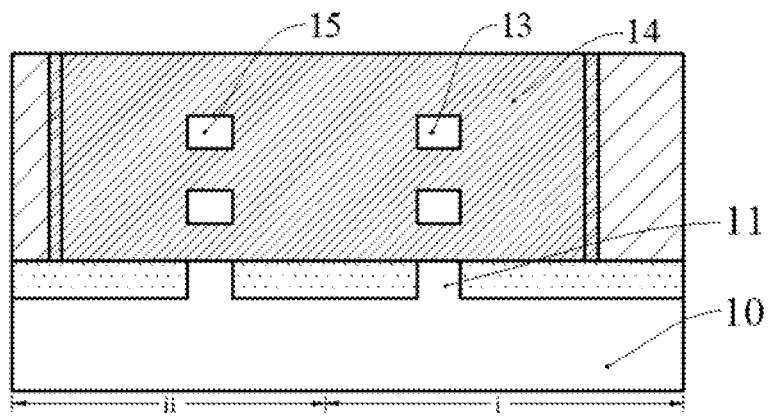

Referring to FIG. 1 and FIG. 2, FIG. 2 is a cross-sectional view of FIG. 1 in a direction AA, which is a schematic structural view of a semiconductor structure.

The semiconductor structure includes: a substrate 10 including a first region i and a second region 11; a plurality of discrete fins 11 located on the substrate 10; discrete first source-drain doped layers 12 on the fin 11 in the first region i; discrete second source-drain doped layers (not shown) on the fin 11 in the second region ii; one or more first channel layers 13 separated from each other and suspended above the fin 11 in the first region i, the first channel layers 13 being located between the first source-drain doped layers 12 and being all in contact with the first source-drain doped layer 12; one or more second channel layers 15 separated from each other and suspended above the fin 11 in the second region ii, the second channel layers 15 being located between the second source-drain doped layers and being all in contact with the second source-drain doped layer; and a gate structure 14 located on the fin 11 and surrounding the first channel layer 13 and the second channel layer 15.

The semiconductor structure is a gate-all-around (GAA) transistor. The gate structure 14 completely surrounds the first channel layer 13 and the second channel layer 15. Therefore, the first channel layer 13 and the second channel layer 15 are strongly controlled by the gate structure 14, helping depletion of the first channel layer 13 and the second channel layer 15. The first source-drain doped layer 12, the gate structure 14, and the first channel layer 13 in the first region i constitute a first transistor, and the second source-drain doped layer, the gate structure 14, and the second channel layer in the second region ii constitute a second transistor. The first transistor and the second transistor share the gate structure 14, helping improve area utilization efficiency of the semiconductor structure. In this semiconductor structure, the first transistor is a PMOS transistor, and the second transistor is an NMOS transistor. Generally, in order to simplify a step of forming the semiconductor structure, the channel regions in the PMOS transistor and the NMOS transistor are made of the same material. However, during operation of the semiconductor structure, a PMOS carrier is a void, and an NMOS carrier is an electron. Since the materials of the channel regions cannot be adjusted according to a transistor type, a migration rate of the carrier in the channel needs to be improved.

In order to address the technical problem, one form of the present disclosure provides a method for forming a semiconductor structure, including: providing a base, the base including: a substrate and a plurality of discrete channel stacks on the substrate, the channel stacks of the plurality of discrete channel stacks including a first channel layer and a second channel layer located on the first channel layer, where the first channel layer and the second channel layer are made of different materials, and a first region and a second region, where the channel stack is located in the first region and the second region; forming an interlayer dielectric layer on the substrate exposed from the channel stack, where a gate opening from which the channel stack is exposed is formed in the interlayer dielectric layer, and a top surface of the interlayer dielectric layer is higher than a top surface of the channel stack; removing the second channel layer of the first region in the gate opening; removing the first channel layer of the second region in the gate opening; after the second channel layer of the first region in the gate opening and the first channel layer of the second region in the gate opening are removed, forming a gate structure in the gate opening, the gate structure surrounding a remainder of the first channel layer and the second channel layer.

In forms of the method for forming a semiconductor structure, after the interlayer dielectric layer is formed, the second channel layer of the first region in the gate opening and the first channel layer of the second region in the gate opening are removed, and then a gate structure is formed in the gate opening, the gate structure surrounding the remaining first channel layer and second channel layer. A channel region in the first region is the first channel layer, a channel region in the second region is the second channel layer, and the channel region in the first region and the channel region in the second region adopt different materials. In this way, channel regions of transistors formed in the first region and the second region are made of different materials, meeting performance requirements of different transistors, thereby optimizing the electrical performance of the semiconductor structure.

In order to make the foregoing objectives, features, and advantages of the embodiments of the present disclosure more apparent and easier to understand, specific embodiments and implementations of the present disclosure are described in detail below with reference to the accompanying drawings.

FIG. 3 to FIG. 14 are schematic structural diagrams corresponding to steps in one form of a method for forming a semiconductor structure according to the present disclosure.

Figure 3:
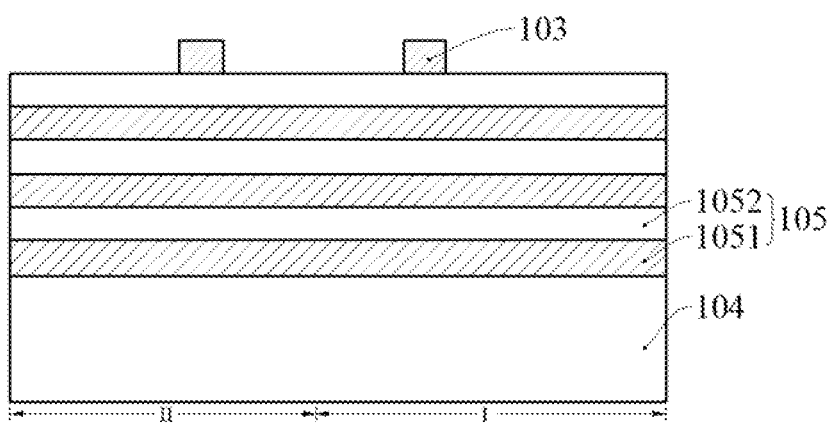
FIG. 3 to FIG. 14 are schematic structural diagrams corresponding to steps in one form of a method for forming a semiconductor structure according to the present disclosure.
Figure 4:
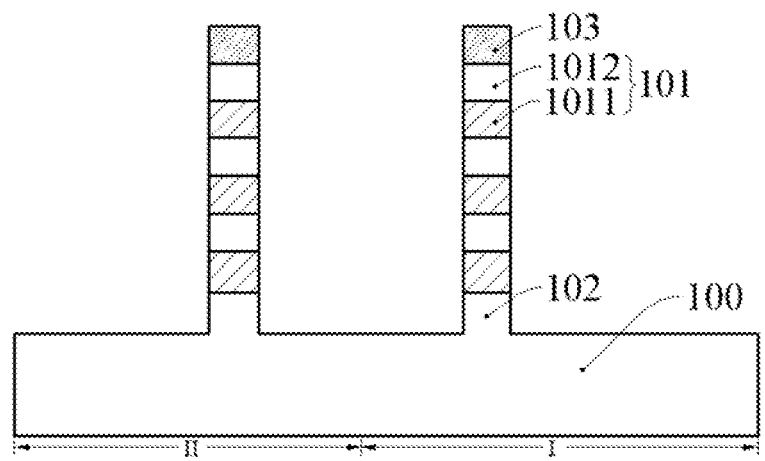

Referring to FIG. 3 and FIG. 4, a base is provided, the base including: a substrate 100 (shown in FIG. 4) and a plurality of discrete channel stacks 101 (shown in FIG. 4) on the substrate 100, each channel stack 101 including a first channel layer 1011 and a second channel layer 1012 located on the first channel layer 1011, the first channel layer 1011 and the second channel layer 1012 being made of different materials, and a first region I and a second region II, the channel stack 101 being located in the first region I and the second region II.

In some implementations, the substrate 100 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

The first region I and the second region II are configured to form transistors of different conductivity types. In some implementations, for example, the first region I is configured to form a PMOS transistor, and the second region II is configured to form an NMOS transistor. Correspondingly, during operation of a subsequently formed semiconductor structure, a carrier of the PMOS transistor is a void, and a carrier of the NMOS transistor is an electron.

In the first region I, a part of the first channel layer 1011 serves as a channel for the PMOS transistor to operate, and a corresponding part of the second channel layer 1012 serves as a sacrificial layer, so as to provide a process basis for subsequently hanging the first channel layer 1011 and occupy a spatial position for a gate structure to be subsequently formed.

In the second region II, a part of the second channel layer 1012 serves as a channel for the NMOS transistor to operate, and a corresponding part of the first channel layer 1011 serves as a sacrificial layer, so as to provide a process basis for subsequently hanging the second channel layer 1012 and occupy space for a gate structure to be subsequently formed.

In some implementations, the first channel layer 1011 and the second channel layer 1012 are made of different materials. During removal of the first channel layer 1011, an etching selectivity between the first channel layer 1011 and the second channel layer 1012 is relatively large. During removal of the second channel layer 1012, an etching selectivity between the second channel layer 1012 and the first channel layer 1011 is relatively large.

In some implementations, the first channel layer 1011 is made of silicon germanium. In other implementations, the first channel layer may also be made of other materials such as germanium, silicon, silicon carbide, gallium arsenide, indium gallium, etc.

In some implementations, the second channel layer 1012 is made of silicon. In other implementations, the second channel layer may also be made of other materials such as germanium, silicon germanium, silicon carbide, gallium arsenide, indium gallium, etc.

In the step of providing the base, the base further includes: a fin 102 located between the substrate 100 and the plurality of channel stacks 101.

In the subsequently formed PMOS transistor, the first channel layer 1011 functions as the channel region, and in the NMOS transistor, the second channel layer 1012 functions as the channel region. The fin 102 separates the channel stack 101 and the substrate 100 by a specific distance, correspondingly facilitating separation of the channel regions of the PMOS transistor and the NMOS transistor from the substrate 100, so that a parasitic device is unlikely to be formed on the top of the substrate, improving the electrical performance of the semiconductor structure.

It should be noted that, in some implementations, the second channel layer 1012 and the fin 102 are made of the same material. In other implementations, the second channel layer and the fin may also be made of different materials.

It should be noted that the step of forming the base includes: providing an initial substrate 104 (shown in FIG. 3), an initial channel stack 105 (shown in FIG. 3) located on the initial substrate 104, and a channel mask layer 103 located on the initial channel stack 105, the initial channel stack 105 including an initial first channel layer 1051 and an initial second channel layer 1052 located on the initial first channel layer 1051; and etching the initial substrate 104 and the initial channel stack 105 by using the channel mask layer 103 as a mask through a dry etching process to form the base.

Referring to FIG. 5 to FIG. 11, an interlayer dielectric layer 110 (shown in FIG. 10) is formed on the substrate 100 exposed from the channel stack 101, a gate opening 115 from which the channel stack 101 is exposed being formed in the interlayer dielectric layer 110, and the top surface of the interlayer dielectric layer 110 being higher than the top surface of the channel stack 101.

During subsequent removal of the second channel layer 1012 of the first region I in the gate opening 115 and during removal of the first channel layer 1011 of the second region II in the gate opening 115, the interlayer dielectric layer 110 can protect other film layers from being damaged.

The interlayer dielectric layer 110 is configured to electrically isolate adjacent semiconductor structures, and is further configured to define a size and a position of a gate structure to be subsequently formed. The interlayer dielectric layer 110 is made of an insulating material.

In some implementations, the interlayer dielectric layer 110 is made of silicon oxide. In other implementations, the interlayer dielectric layer may also be made of one or more of silicon oxide, silicon nitride, silicon oxynitride, silicon oxycarbide, silicon carbonitride, and silicon oxycarbonitride.

Specifically, the step of forming the interlayer dielectric layer 110 includes: forming an interlayer dielectric film (not shown) on the substrate 100, and etching back a part of the interlayer dielectric film in thickness, the remaining part of the interlayer dielectric film serving as the interlayer dielectric layer 110.

In some implementations, the interlayer dielectric film is formed by using a flowable chemical vapor deposition (FCVD) process.

Figure 6:
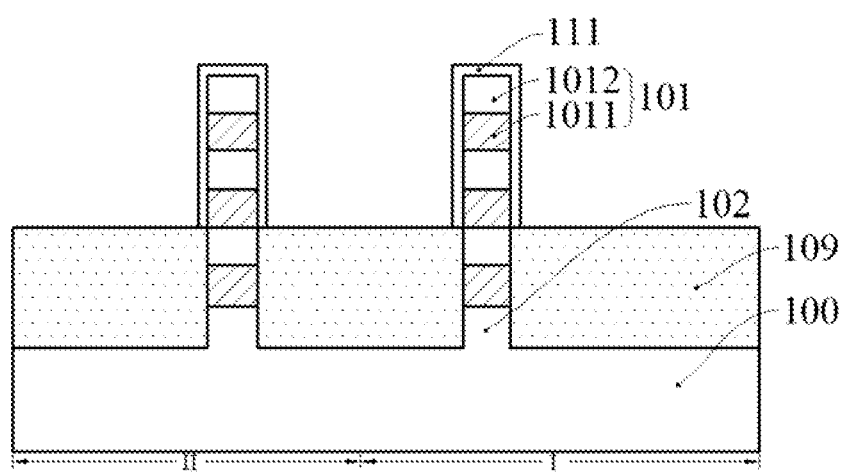
Figure 7:
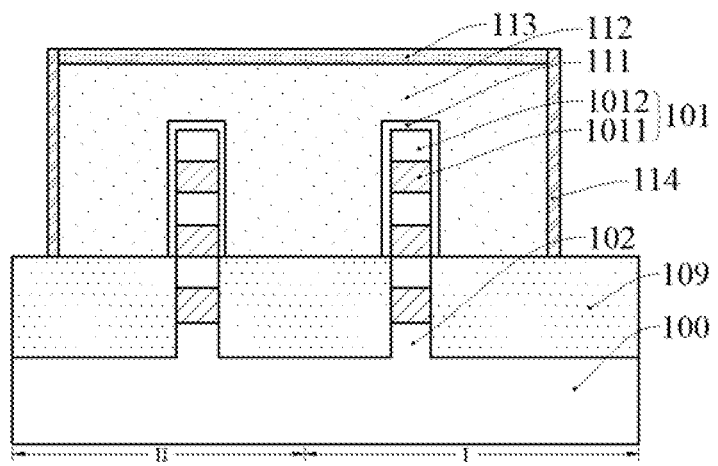

As shown in FIG. 6 and FIG. 7, the method for forming a semiconductor structure further includes: after the base is provided and before the interlayer dielectric layer is formed on the substrate 100 exposed from the channel stack 101, forming a dummy gate structure 112 (shown in FIG. 7) spanning the channel stack 101 and covering a part of the top wall and a part of a sidewall of the channel stack 101.

The dummy gate structure 112 occupies a spatial position for a gate structure to be subsequently formed.

In some implementations, the dummy gate structure 112 is made of a material including polysilicon.

Specifically, the step of forming the dummy gate structure 112 includes: forming a dummy gate material layer (not shown) covering the channel stack 101; forming a gate mask layer 113 on the dummy gate material layer; and etching the dummy gate material layer using the gate mask layer 113 as a mask to form the dummy gate structure 112.

It should be noted that after the dummy gate structure 112 is formed, a gate spacer layer 114 is formed on two sidewalls perpendicular to a direction in which the dummy gate structure 112 extends.

During subsequent removal of the dummy gate structure 112, the gate spacer layer 114 is configured to protect the subsequently formed interlayer dielectric layer from being damaged, facilitating control of a formation position of the gate structure to be subsequently formed.

Specifically, the gate spacer layer 114 is made of a material including one or more of silicon oxide, silicon nitride, silicon oxynitride, silicon oxycarbide, silicon carbonitride, and silicon oxycarbonitride. In some implementations, the gate spacer layer 114 is made of a material including silicon nitride.

It should be noted that the method for forming a semiconductor structure further includes: after the base is formed and before the dummy gate structure 112 is formed, forming a protective layer 111 (shown in FIG. 6) on the top wall and the sidewall of the channel stack 101.

During subsequent removal of the dummy gate structure 112, the protective layer 111 is configured to protect the channel stack 101 from being damaged.

Specifically, the protective layer 111 is made of a material including one or more of silicon oxide, silicon oxynitride, and silicon nitride. In some implementations, the protective layer 111 is made of a material including silicon oxide.

In some implementations, the protective layer 111 is formed by using an atomic layer deposition (ALD) process. The atomic layer deposition process includes a plurality of atomic layer deposition cycles, helping improve thickness uniformity of the protective layer 111, so that the protective layer 111 can conformally cover the sidewall and the top wall of the channel stack 101 in thickness. In other implementations, the protective layer may also be formed using the chemical vapor deposition process.

It should be noted that the method for forming a semiconductor structure further includes: after the dummy gate structure 112 is formed, forming a first source-drain doped layer (not shown) in the channel stack 101 on two sides of the dummy gate structure 112 in the first region I, and forming a second source-drain doped layer in the channel stack 101 on two sides of the dummy gate structure 112 in the second region II.

Figure 8:
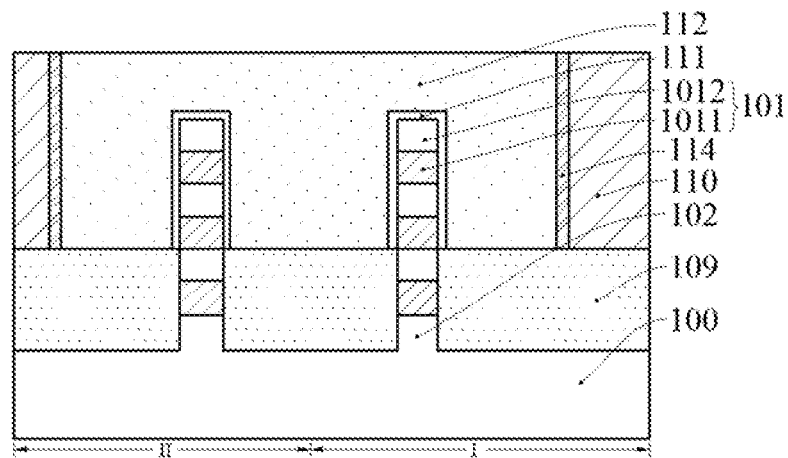

As shown in FIG. 8, in the step of forming the interlayer dielectric layer 110, the interlayer dielectric film covers the dummy gate structure 112. During etching back of a part of the interlayer dielectric film in thickness, the interlayer dielectric film higher than the dummy gate structure 112 is removed, the remaining part of the interlayer dielectric film serves as the interlayer dielectric layer 110. Correspondingly, the interlayer dielectric layer 110 is formed on the substrate 100 at a side of the dummy gate structure 112.

Figure 9:
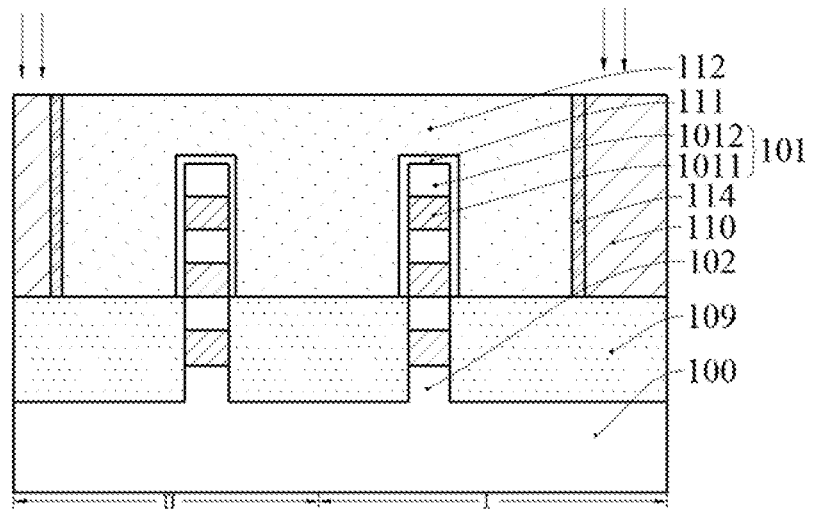
Figure 10:
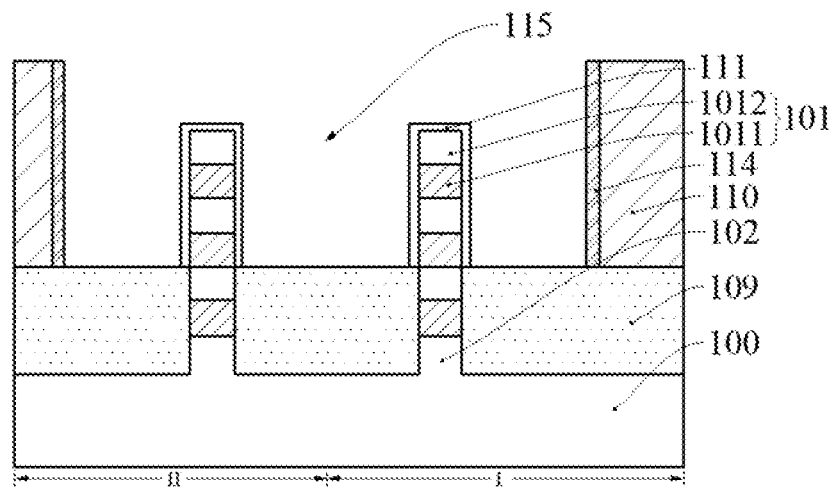

As shown in FIG. 9 and FIG. 10, the step of forming the gate opening 115 includes: removing the dummy gate structure 112 to form the gate opening 115 located in the interlayer dielectric layer 110. The gate opening 115 provides a process space for subsequently forming the gate structure.

In some implementations, the dummy gate structure 112 is removed by using the wet etching process. The wet etching process has a high etching rate, simple operations, and low process costs.

In some implementations, the dummy gate structure 112 is made of a material including polysilicon, and a corresponding wet etching solution includes tetramethylammonium hydroxide (TMAH).

It should be noted that, in the step of removing the dummy gate structure 112, the dummy gate structure 112 is removed at a rate greater than a rate at which the protective layer 111 is removed.

The method for forming a semiconductor structure further includes: after the interlayer dielectric layer 110 is formed and before the dummy gate structure 112 is removed, doping the interlayer dielectric layer 110 with ions, which is shown in FIG. 9.

The interlayer dielectric layer 110 is doped with ions to improve an etching selectivity between the dummy gate structure 112 and the interlayer dielectric layer 110.

Specifically, the doped ions include one or more of Si, C and N. In some implementations, the doped ions include Si.

Figure 5:
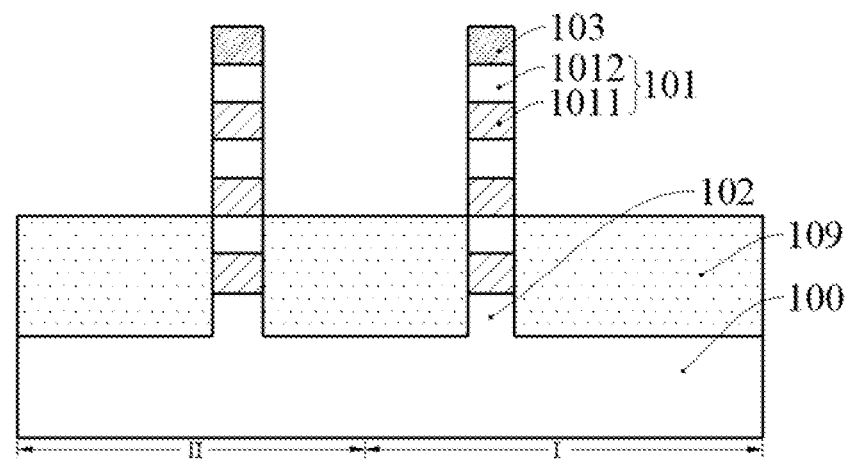
Figure 11:
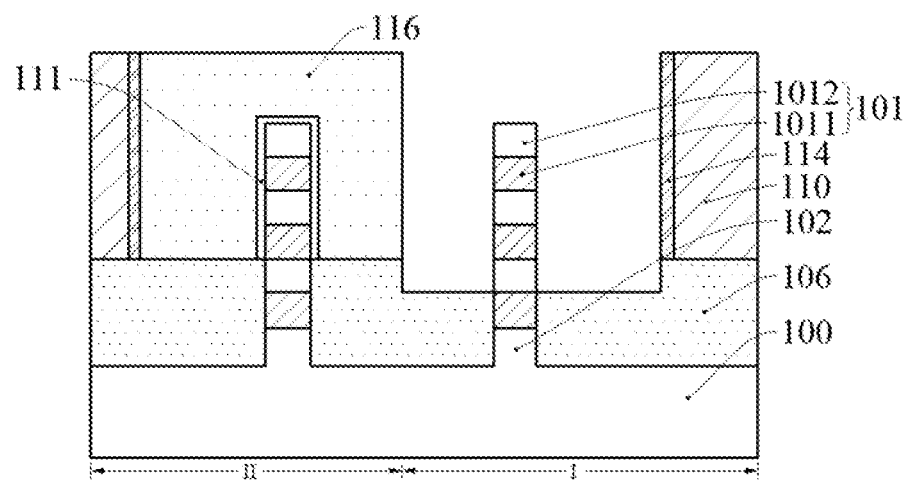

Referring to FIGS. 5 and 11, after the base is provided and before the second channel layer 1012 of the first region I in the gate opening 115 and the first channel layer 1011 of the second region II in the gate opening 115 are removed, an isolation material layer 106 is formed on the substrate 100 between the channel stacks 101 (shown in FIG. 11).

In some implementations, the isolation material layer 106 covers a part of the first channel layer 1011 and the second channel 1012. The isolation material layer 106 is configured to define a number of channel regions to be subsequently formed in the PMOS transistor and the NMOS transistor. In a subsequent process, during removal of the second channel layer 1012 exposed from the isolation material layer 106 in the first region I, the isolation material layer 106 is configured to protect the second channel layer 1012 in the isolation material layer 106. During removal of the first channel layer 1011 exposed from the isolation material layer 106 in the second region II, the isolation material layer 106 is configured to protect the first channel layer 1011 in the isolation material layer 106.

In addition, the isolation material layer 106 is further configured to electrically isolate the substrate 100 and the subsequently formed gate structure.

It should be noted that, in some implementations, at least two channel stacks 101 are exposed from the isolation material layer 106. In this case, subsequently, there are more than two channel regions in the PMOS transistor and the NMOS transistor, helping increase a carrier migration rate during operation of the semiconductor structure. Specifically, the step of forming the isolation spacer layer 106 includes:

before the interlayer dielectric layer 110 is formed on the substrate 100 between the channel stacks 101, forming an isolation material film 109 on the substrate 100 between the channel stacks 101, the isolation material film 109 covering the bottommost channel stack 101, which is shown in FIG. 5.

The isolation material film 109 is configured to prepare for subsequently forming the isolation material layer.

In some implementations, the isolation material film 109 is made of silicon oxide. In other implementations, the isolation material film may also be made of silicon nitride or silicon oxynitride.

The step of forming the isolation material film 109 includes: forming an isolation structure (not shown) covering the channel mask layer 103; flattening the isolation structure by using the top of the channel mask layer 103 as an etch stop position; and after the flattening, etching a part of the isolation structure in thickness by using the channel mask layer 103 as a mask, the remaining part of the isolation structure serving the isolation material film 109.

In some implementations, the isolation structure covering the channel mask layer 103 is formed using the flowable chemical vapor deposition process. The flowable chemical vapor deposition process has a good filling capability and is adapted to fill openings with a high aspect ratio, helping reduce a probability of forming defects such as voids in the isolation structure, correspondingly improving film formation quality of the isolation material film 109.

It should be noted that, the step of forming the interlayer dielectric layer 110 on the substrate 100 exposed from the channel stack 101 includes: forming the interlayer dielectric layer 110 on the isolation material film 109.

It should be further noted that, in the step of forming the isolation material film 109, the top surface of the isolation material film 109 is flush with the top surface of the bottommost channel stack 101.

As shown in FIG. 11, the method for forming a semiconductor structure further includes: after the gate opening 115 is formed, etching a part of the isolation material film 109 in the first region I in thickness to expose a sidewall of the second channel layer 1012 in the bottommost channel stack 101, the remaining part of the isolation material film 109 serving as the isolation material layer 106.

Specifically, the step of etching a part of the isolation material film 109 in the first region I in thickness includes: forming a first mask layer 116 covering the second region II but exposing the first region I; and etching a part of the isolation material film 109 in the first region I in thickness by using the first mask layer 116 as a mask.

In some implementations, a part of the isolation material film 109 in the first region I in thickness is etched using a Certas process to form the isolation material layer 106. The Certas process is an etching process similar to the atomic layer etching (ALE) process. Certas is an isotropic dry etching process. Using the Certas process helps reduce a probability of forming dishing on the top of the isolation material layer 106, and can improve etching uniformity, so that the isolation material layer 106 in the first region I has relatively high height consistency. In some implementations, an etching gas used in the Certas process includes hydrogen fluoride gas.

It should be noted that, in the step of etching a part of the isolation material film 109 in the first region I in thickness to form the isolation material layer 106, the protective layer 111 in the first region I is removed.

In some implementations, the protective layer 111 is made of silicon oxide, and the isolation material film 109 is made of silicon oxide. Therefore, the protective layer 111 and a part of the isolation material film 109 in thickness can be removed in one step.

It should be noted that in some implementations, the interlayer dielectric layer 110 is formed before the isolation material layer 106 is formed, for example.

In other implementations, the isolation material layer may also be formed before the interlayer dielectric layer is formed.

Correspondingly, forms of the method for forming a semiconductor structure further includes: after the base is provided and before the interlayer dielectric layer is formed, forming an isolation material layer on the substrate between the channel stacks.

The step of forming the isolation material layer includes: forming an isolation material film on the substrate between the channel stacks, the isolation material film covering the bottommost channel stack; and after the isolation material film is formed, etching a part of the isolation material film in the first region in thickness to expose a sidewall of the second channel layer in the bottommost channel stack, the remaining part of the isolation material film serving as the isolation material layer.

In the step of forming the interlayer dielectric layer on the substrate between the channel stacks, the interlayer dielectric layer is formed on the isolation material layer.

Figure 12:
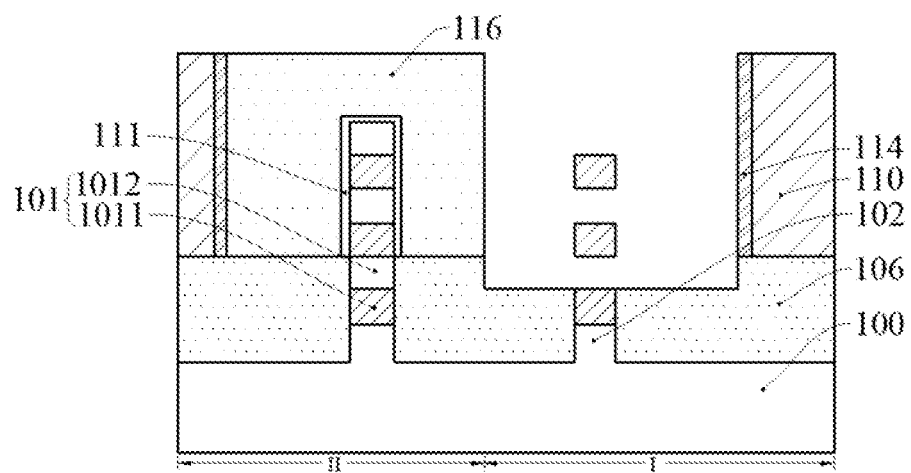

Referring to FIG. 12, the second channel layer 1012 of the first region I in the gate opening 115 is removed.

The second channel layer 1012 of the first region I in the gate opening 115 is removed, so that the first channel layer 1011 of the first region I in the gate opening 115 is retained. Therefore, the first channel layer 1011 serves as a channel region for the PMOS transistor subsequently formed in the first region I.

In the step of removing the second channel layer 1012 of the first region I in the gate opening 115, the second channel layer 1012 exposed from the first mask layer 116 is removed. Specifically, the second channel layer 1012 exposed from the first mask layer 116, the isolation material layer 106, and the interlayer dielectric layer 110 is removed.

In some implementations, the second channel layer 1012 of the first region I in the gate opening 115 is removed by using the wet etching process. The wet etching process has a high etching rate, simple operations, and low process costs.

In some implementations, the second channel layer 1012 is made of silicon, and a corresponding etching solution for removing the second channel layer 1012 includes a tetramethylammonium hydroxide solution.

The method for forming a semiconductor structure further includes: after the second channel layer 1012 of the first region I in the gate opening 115 is removed, removing the first mask layer 116.

Figure 13:
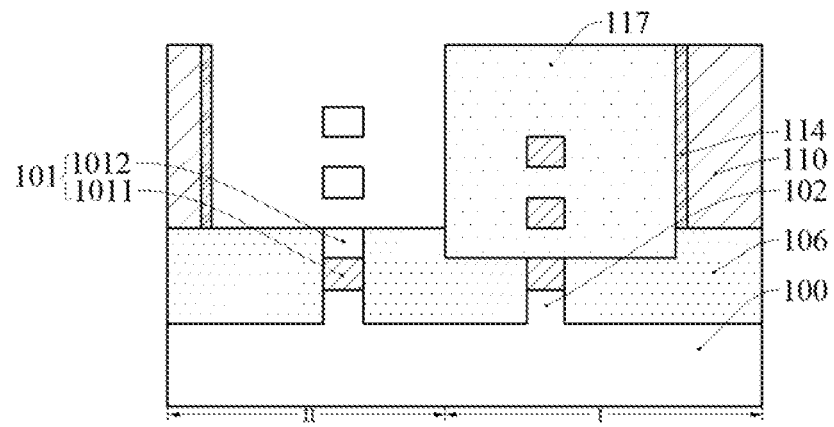

Referring to FIG. 13, the first channel layer 1011 of the second region II in the gate opening 15 is removed.

The first channel layer 1011 of the second region II in the gate opening 115 is removed, so that the first channel layer 1011 of the second region II in the gate opening 115 is retained. Therefore, the second channel layer 1012 serves as a channel region for the NMOS transistor subsequently formed in the second region II.

The step of removing the first channel layer 1011 the second region II in the gate opening 115 includes: forming, in the gate opening 115, a second mask layer 117 covering the first region I and but exposing the second region II; and removing the first channel layer 1011 exposed from the second mask layer 117.

In the step of removing the first channel layer 1011 of the second region II in the gate opening 115, the first channel layer 1011 exposed from the first mask layer 117 is removed. Specifically, the first channel layer 1011 exposed from the second mask layer 117, the isolation material layer 106, and the interlayer dielectric layer 110 is removed.

In some implementations, the first channel layer 1011 of the second region II in the gate opening 115 is removed using the wet etching process. The wet etching process has a high etching rate, simple operations, and low process costs.

In some implementations, the first channel layer 1011 is made of silicon germanium, and a corresponding etching solution for removing the first channel layer 1011 includes a hydrogen chloride solution.

It should be noted that the method for forming a semiconductor structure further includes: After the second mask layer 117 is formed and before the first channel layer 1011 of the second region II in the gate opening 115 is removed, the protective layer 111 in the first region I is removed.

In some implementations, the protective layer 111 in the first region I is removed by using the Certas etching process. The protective layer 111 is made of silicon oxide, and a corresponding etching gas used in the Certas etching process includes hydrogen fluoride gas.

The method for forming a semiconductor structure further includes: after the first channel layer 1011 of the second region II in the gate opening 115 is removed, removing the second mask layer 117.

Figure 14:
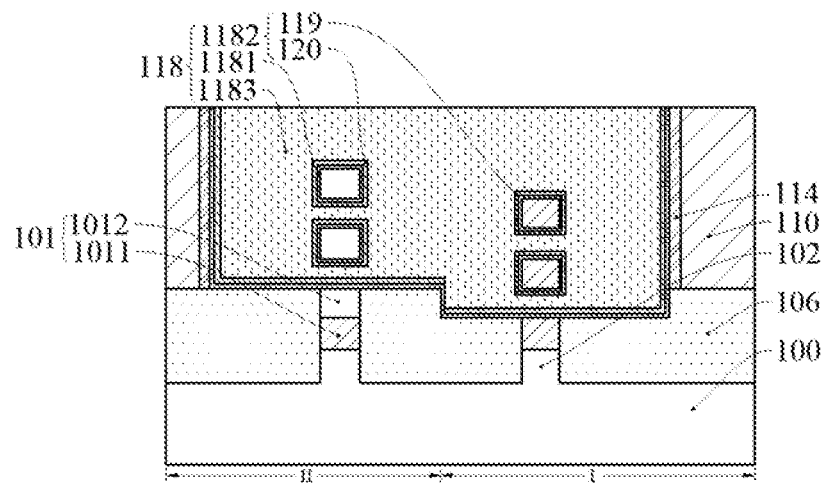

Referring to FIG. 14, after the second channel layer 1012 of the first region I in the gate opening 115 and the first channel layer 1011 of the second region II in the gate opening 115 are removed, a gate structure 118 is formed in the gate opening 115, the gate structure 118 surrounding rests of the first channel layer 1011 and the second channel layer 1012.

In the method for forming a semiconductor structure provided in some implementations of the present disclosure, after the interlayer dielectric layer 110 is formed, the second channel layer 1012 of the first region I in the gate opening 115 and the first channel layer 1011 of the second region II in the gate opening 115 are removed, and then a gate structure 118 is formed in the gate opening 115, the gate structure 118 surrounding the remaining first channel layer 1011 and second channel layer 1012. A channel region in the first region I is the first channel layer 1011, a channel region in the second region II is the second channel layer 1012, and the channel region in the first region I and the channel region in the second region II adopt different materials. In this way, channel regions of transistors formed in the first region I and the second region II are made of different materials, meeting performance requirements of different transistors, thereby optimizing the electrical performance of the semiconductor structure.

Specifically, the gate structure 118 surrounds the first channel layer 1011 and the second channel layer 1012 exposed from the interlayer dielectric layer 110 and the isolation material layer 106.

During operation of the semiconductor structure, the gate structure 118 is configured to control opening and closing of the channel.

In some implementations, the gate structure 118 includes a gate dielectric layer 1181, a work function layer 1182 located on the gate dielectric layer 1181, and a metal gate layer 1183 located on the work function layer 1182.

The gate dielectric layer 1181 is configured to electrically isolate the metal gate layer 1183 and the first channel layer 1011, and electrically isolate the metal gate layer 1183 and the second channel layer 1012.

It should be noted that the gate dielectric layer 1181 is made of a high-k dielectric material. The high-k dielectric material refers to a dielectric material having a relative dielectric constant greater than a relative dielectric constant of silicon oxide.

In some implementations, the gate dielectric layer 1181 is made of $HfO_2$. In other implementations, the gate dielectric layer may also be made of one or more of $ZrO_2$, HfSiO, HfSiON, HfTaO, HfTiO, HfZrO, or $Al_2O_3$.

It should be noted that the gate dielectric layer 1181 conformally covers the first channel layer 1011 in the first region I higher than the isolation material layer 106 and the second channel layer 1012 in the second region II higher than the isolation material layer 106. In addition, the gate dielectric layer 1181 is further formed on the isolation material layer 206.

The work function layer 1182 is configured to adjust a threshold voltage of the semiconductor structure during operation of the semiconductor structure. In some implementations, the work function layer 1182 includes a first work function layer 119 located in the first region I and a second work function layer 120 located in the second region II.

In some implementations, the first work function layer 119 is made of a material including titanium nitride, tantalum nitride, titanium carbide, tantalum silicon nitride, titanium silicon nitride, or tantalum carbide. The second work function layer 120 is made of a material including titanium aluminide, tantalum carbide, aluminum, or titanium carbide.

The metal gate layer 1183 serves as an electrode for an electrical connection to an external circuit.

In some implementations, the metal gate layer 1183 is made of magnesium-tungsten alloy. In other implementations, the metal gate structure may also be made of W, Al, Cu, Ag, Au, Pt, Ni, or Ti, etc.

It should be noted that, in other implementations, in the step of forming the isolation material layer, the top surface of the isolation material layer in the first region I is flush with the top surface of the isolation material layer in the second region II, and the top surface of the isolation material layer is flush with the top surface of the fin.

In this case, after the second channel layer of the first region and the first channel layer of the second region in the gate opening are removed, the gate structure cannot completely surround the first channel layer in the first region closest to the isolation material layer.

Figure 15:
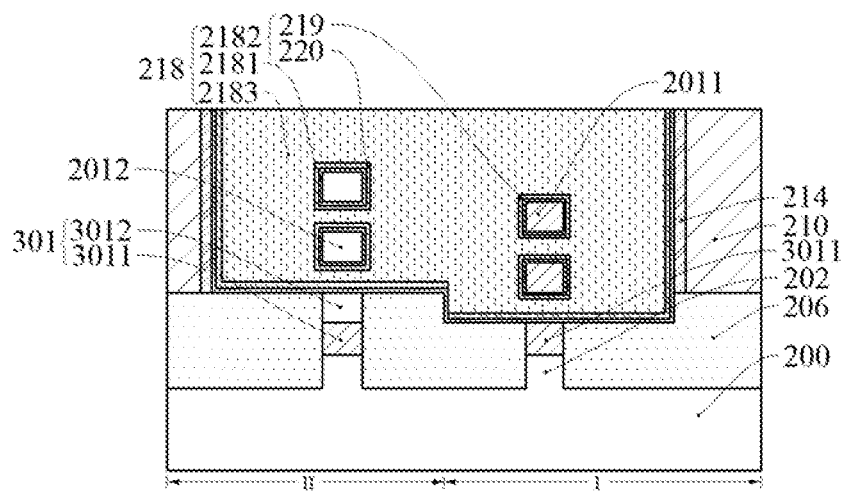
FIG. 15 is a schematic structural diagram of one form of a semiconductor structure according to the present disclosure.

The present disclosure further provides a semiconductor structure. FIG. 15 is a schematic structural diagram of one form of a semiconductor structure according to the present disclosure.

The semiconductor structure includes: a substrate 200 including a first region I and a second region II; a plurality of first channel layers 2011 separated from each other and suspended on the substrate 200 in the first region I; a plurality of second channel layers 2012 separated from each other and suspended on the substrate 200 in the second region II, the second channel layer 2012 and the first channel layer 2011 being made of different materials; and a gate structure 218 located on the substrates 200 in the first region I and the second region II and surrounding the first channel layer 2011 and the second channel layer 2012.

In the semiconductor structure provided in some implementations of the present disclosure, the gate structure 218 surrounds the first channel layer 2011 and the second channel layer 2012, a channel region in the first region I is the first channel layer 2011, a channel region in the second region II is the second channel layer 2012, and the channel region in the first region I and the channel region in the second region II adopt different materials. In this way, corresponding channel regions of transistors formed in the first region I and the second region II are made of different materials, meeting performance requirements of different transistors, thereby optimizing the electrical performance of the semiconductor structure.

In some implementations, the substrate 200 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

Transistors formed in the first region I and the second region II have different conductivity types. In some implementations, for example, the first region I is a PMOS transistor, and the second region II is an NMOS transistor. Correspondingly, during operation of the semiconductor structure, a carrier of the PMOS transistor is a void, and a carrier of the NMOS transistor is an electron.

In the first region I, the first channel layer 2011 serves as a channel for the PMOS transistor to operate. In the second region II, the second channel layer 2012 serves as a channel for the NMOS transistor to operate.

In some implementations, the first channel layer 2011 and the second channel layer 2012 are made of different materials.

Specifically, the first channel layer 2011 is made of silicon germanium. In other implementations, the first channel layer may also be made of other materials such as germanium, silicon, silicon carbide, gallium arsenide, indium gallium, etc.

The second channel layer 2012 is made of silicon. In other implementations, the second channel layer may also be made of other materials such as germanium, silicon germanium, silicon carbide, gallium arsenide, indium gallium, etc.

In some implementations, a number of first channel layers 2011 in the first region I is the same as a number of second channel layers 2012 in the second region II.

During operation of the semiconductor structure, a carrier in the PMOS transistor has a size the same as a size of a carrier in the NMOS transistor.

It should be noted that in some implementations, there are at least two first channel layers 2011 on the substrate 200 in the first region I and at least two second channel layers 2012 on the substrate 200 in the second region II. In this case, there are at least two channel regions in both of the PMOS transistor and the NMOS transistor, helping increase a carrier migration rate during operation of the semiconductor structure.

The semiconductor structure further includes: an isolation material layer 206 located on the substrate 200; a plurality of first channel layers 2011 separated from each other and suspended on the isolation material layer 206 in the first region I; and a plurality of second channel layers 2012 separated from each other and suspended on the isolation material layer 206 in the second region II. The isolation material layer 206 is configured to electrically isolate the gate structure 218 and the substrate 200.

In some implementations, the isolation material layer 206 is made of silicon oxide. In other implementations, the isolation material layer may also be made of silicon nitride or silicon oxynitride.

In some implementations, the gate structure 218 has two opposite sidewalls in a direction perpendicular to a direction in which the gate structure 218 extends. Projections of the first channel layer 2011 and the second channel layer 2012 on either of the opposite sidewalls of the gate structure 218 are alternately disposed, a projection of the topmost second channel layer 2012 on either of the opposite sidewalls is located above a projection of the topmost first channel layer 2011 on either of the opposite sidewalls, and a projection of the bottommost first channel layer 2011 on either of the opposite sidewalls is located below a projection of the bottommost second channel layer 2012 on either of the opposite sidewalls.

Generally, a step of forming the semiconductor structure includes: forming a plurality of discrete channel stacks (not shown) on the substrate 200, the channel stack including a first channel layer 2011 and a second channel layer 2012 located on the first channel layer 2011;

removing the second channel layer 2012 in the first region I; and removing the first channel layer 2011 in the second region II.

Projections of the first channel layer 2011 and the second channel layer 2012 are alternately disposed on the opposite sidewalls, and a process for forming the structures of the first channel layer 2011 and the second channel layer 2012 is simple, helping improve the formation efficiency of the semiconductor structure.

The semiconductor structure further includes: a first channel film 3011 located in the isolation material layer 206 in the first region I, the isolation material layer 206 covering a sidewall of the first channel film 3011 but exposing the top surface of the first channel film 3011.

The semiconductor structure further includes: a channel stack film 301 located in the isolation material layer 206 in the second region II and including a first channel film 3011 and a second channel film 3012 located on the first channel film 3011, the isolation material layer 206 covering the channel stack film 301 but exposing the top surface of the channel stack film 301.

Compared to the first channel film 3011, the channel stack film 301 lacks the second channel film 3012. Therefore, the top surface of the channel stack film 301 is higher than the top surface of the first channel film 3011. Correspondingly, the top of the isolation material layer 206 in the first region I is lower than the top of the isolation material layer 206 in the second region II, so that a number of first channel layers 2011 exposed from the isolation material layer 206 may be equal to a number of second channel layers 2012 exposed from the isolation material layer.

In some implementations, a quantity of first channel layers 2011 is the same as a quantity of second channel layers 2012. During operation of the semiconductor structure, the PMOS transistor and the NMOS transistor has the same carrier migration rate.

It should be noted that the top surface of the isolation material layer 206 in the first region I is lower than the top surface of the isolation material layer 206 in the second region II, and a difference between the isolation material layer 206 in the second region II and the isolation material layer 206 in the first region I by a thickness of one second channel film 3012.

The semiconductor structure further includes: a fin 202 located between the first channel film 3011 and the substrate 200 in the first region I and between the substrate 200 and the plurality of channel stack films 301 in the second region II.

The fin 202 separates the channel stack 301 and the substrate 200 by a specific distance, so that the isolation material layer 206 has a sufficient thickness, facilitating electrical isolation between the gate structure 218 and the substrate 200. In addition, the fin 202 separates the channel stack 301 and the substrate 200 by a specific distance, so that a parasitic device is unlikely to be formed on the top of the substrate 200, improving the electrical performance of the semiconductor structure.

It should be noted that, in some implementations, the second channel layer 2012 and the fin 202 are made of the same material. In other implementations, the second channel layer and the fin may also be made of different materials.

During operation of the semiconductor structure, the gate structure 218 is configured to control opening and closing of the channel.

In some implementations, the gate structure 218 includes a gate dielectric layer 2181, a work function layer 2182 located on the gate dielectric layer 2181, and a metal gate layer 2183 located on the work function layer 2182.

The gate dielectric layer 2181 is configured to electrically isolate the metal gate layer 2183 and the first channel layer 2011, and electrically isolate the metal gate layer 2183 and the second channel layer 2012.

It should be noted that the gate dielectric layer 2181 is made of a high-k dielectric material. The high-k dielectric material refers to a dielectric material having a relative dielectric constant greater than a relative dielectric constant of silicon oxide.

In some implementations, the gate dielectric layer 2181 is made of $HfO_2$. In other implementations, the gate dielectric layer may also be made of one or more of $ZrO_2$, HfSiO, HfSiON, HfTaO, HfTiO, HfZrO, or $Al_2O_3$.

It should be noted that the gate dielectric layer 2181 conformally covers the first channel layer 2011 in the first region I and the second channel layer 2012 in the second region II. The gate dielectric layer 2181 further covers the isolation material layer 206.

The work function layer 2182 is configured to adjust a threshold voltage of the semiconductor structure during operation of the semiconductor structure. In some implementations, the work function layer 2182 includes a first work function layer 219 located in the first region I and a second work function layer 220 located in the second region II.

In some implementations, the first work function layer 219 is made of a material including titanium nitride, tantalum nitride, titanium carbide, tantalum silicon nitride, titanium silicon nitride, or tantalum carbide. The second work function layer 220 is made of a material including titanium aluminide, tantalum carbide, aluminum, or titanium carbide.

The metal gate layer 2183 serves as an electrode for an electrical connection to an external circuit. In some implementations, the metal gate layer 2183 is made of magnesium-tungsten alloy. In other implementations, the metal gate structure may also be made of W, Al, Cu, Ag, Au, Pt, Ni, or Ti, etc.

The semiconductor structure further includes: a first source-drain doped layer (not shown) located at and connected to two ends of a direction in which the first channel layer 2011 extends; and a second source-drain doped layer (not shown) located at and connected to two ends of a direction in which the second channel layer 2012 extends.

The semiconductor structure further includes: a gate spacer layer 214 located on the opposite sidewalls. The gate spacer layer 214 is configured to protect a sidewall of the gate structure 218.

Specifically, the gate spacer layer 214 is made of a material including one or more of silicon oxide, silicon nitride, silicon oxynitride, silicon oxycarbide, silicon carbonitride, and silicon oxycarbonitride. In some implementations, the gate spacer layer 214 is made of a material including silicon nitride.

The semiconductor structure further includes: an interlayer dielectric layer 210 located on the isolation material layer 206 exposed from the gate structure 218 and covering the first source-drain doped layer and the second source-drain doped layer.

The interlayer dielectric layer 210 is made of an insulating material.

In some implementations, the interlayer dielectric layer 210 is made of silicon oxide. In other implementations, the interlayer dielectric layer may also be made of one or more of silicon oxide, silicon nitride, silicon oxynitride, silicon oxycarbide, silicon carbonitride, and silicon oxycarbonitride.

It should be noted that the interlayer dielectric layer 210 has doped ions. The doped ions can improve etching resistance of the interlayer dielectric layer 210.

Specifically, the doped ions include one or more of Si, C and N. In some implementations, the doped ions include Si.

It should be noted that, in other implementations, the top surface of the isolation material layer in the first region is flush with the top surface of the isolation material layer in the second region, and the top surface of the isolation material layer is flush with the top surface of the fin.

In this case, the gate structure cannot cover the first channel layer in the first region closest to the isolation material layer, and correspondingly, the formed gate structure cannot completely surround the first channel layer in the first region I closest to the isolation material layer.

Although embodiments and implementations of the present disclosure are disclosed above, the present disclosure is not limited thereto. Any person skilled in the art can make various changes and modifications without departing from the spirit and the scope of the present disclosure, and therefore the protection scope of the present disclosure should be subject to the scope defined by the claims.

What is claimed is:

1. A method for forming a semiconductor structure, comprising:
   providing a base, the base comprising:
      a substrate; and
      a channel stack comprising:
         a first channel layer;
         a second channel layer located on the first channel layer, where the first channel layer and the second channel layer are made of different materials, and
         a first region and a second region, where the channel stack is located in the first region and the second region;
   forming an interlayer dielectric layer on the substrate exposed from the channel stack, where a gate opening from which the channel stack is exposed is formed in the interlayer dielectric layer, and a top surface of the interlayer dielectric layer is higher than a top surface of the channel stack;
   removing the second channel layer of the first region in the gate opening;
   removing the first channel layer of the second region in the gate opening;
   after the second channel layer of the first region in the gate opening and the first channel layer of the second region in the gate opening are removed, forming a gate structure in the gate opening, the gate structure surrounding rests of the first channel layer and the second channel layer.

2. The method for forming a semiconductor structure according to claim 1, wherein:
   the base comprises a plurality of channel stacks;
   after the base is provided and before the second channel layer of the first region in the gate opening and the first channel layer of the second region in the gate opening are removed, an isolation material layer is formed on the substrate between the channel stacks of the plurality of channel stacks;
   forming the isolation material layer comprises: forming an isolation material film on the substrate between the channel stacks of the plurality of channel stacks, where the isolation material film covers a bottommost channel stack of the plurality of channel stacks;
   forming the interlayer dielectric layer on the substrate exposed from the channel stack comprises: forming the interlayer dielectric layer on the isolation material film; and
   the method for forming a semiconductor structure further comprises: after the gate opening is formed, etching a part of the isolation material film in the first region in thickness to expose a sidewall of the second channel layer in the bottommost channel stack, where a remaining part of the isolation material film serves as the isolation material layer.

3. The method for forming a semiconductor structure according to claim 2, wherein etching a part of the isolation material film in the first region in thickness comprises:
   forming a first mask layer covering the second region but exposing the first region; and
   etching a part of the isolation material film in the first region in thickness by using the first mask layer as a mask.

4. The method for forming a semiconductor structure according to claim 1, wherein:
   the base comprises a plurality of channel stacks;
   after the base is provided and before the interlayer dielectric layer is formed, an isolation material layer is formed on the substrate between the channel stacks;
   forming the isolation material layer comprises:
      forming an isolation material film on the substrate between the channel stacks of the plurality of channel stacks, where the isolation material film covers a bottommost channel stack of the plurality of channel stacks; and
      after the isolation material film is formed, etching a part of the isolation material film in the first region in thickness to expose a sidewall of the second channel layer in the bottommost channel stack, where a remaining part of the isolation material film serves as the isolation material layer; and
   forming the interlayer dielectric layer on the substrate between the channel stacks of the plurality of channel stacks comprises forming the interlayer dielectric layer on the isolation material layer.

5. The method for forming a semiconductor structure according to claim 4, wherein a part of the isolation material film in the first region in thickness is etched using a Certas process to form the isolation material layer.

6. The method for forming a semiconductor structure according to claim 4, wherein removing the second channel layer of the first region in the gate opening comprises removing the second channel layer exposed from the first mask layer.

7. The method for forming a semiconductor structure according to claim 1, wherein the second channel layer of the first region in the gate opening is removed using a wet etching process.

8. The method for forming a semiconductor structure according to claim 1, wherein the step of removing the first channel layer of the second region in the gate opening comprises:
forming, in the gate opening, a second mask layer covering the first region but exposing the second region; and
removing the first channel layer exposed from the second mask layer.

9. The method for forming a semiconductor structure according to claim 1, wherein the first channel layer of the second region in the gate opening is removed using a wet etching process.

10. The method for forming a semiconductor structure according to claim 1, further comprising:
after the base is provided and before the interlayer dielectric layer is formed on the substrate exposed from the channel stack, forming a dummy gate structure spanning the channel stack and covering a part of a top wall and a part of a sidewall of the channel stack;
wherein forming the interlayer dielectric layer comprises forming the interlayer dielectric layer on the substrate on a side of the dummy gate structure; and
wherein forming the gate opening comprises removing the dummy gate structure to form the gate opening located in the interlayer dielectric layer.

11. The method for forming a semiconductor structure according to claim 10, further comprising: after the base is provided and before the dummy gate structure is formed, forming a protective layer on the top wall and the sidewall of the channel stack;
wherein removing the dummy gate structure comprises removing the dummy gate structure at a rate greater than a rate at which the protective layer is removed.

12. The method for forming a semiconductor structure according to claim 1, wherein:
the first region is configured to form a PMOS, and the second region is configured to form an NMOS; and
the first channel layer is made of a material comprising SiGe, and the second channel layer is made of a material comprising Si.

13. The method for forming a semiconductor structure according to claim 1, wherein the base further comprises: a fin located between the substrate and the channel stack; and
the method for forming a semiconductor structure further comprises: after the base is provided and before the interlayer dielectric layer is formed, forming an isolation material layer on the substrate between the channel stack and the fin, where a top surface of the isolation material layer in the first region is flush with a top surface of the isolation material layer in the second region, and a top surface of the isolation material layer is flush with a top surface of the fin.

14. The method for forming a semiconductor structure according to claim 1, wherein providing the base comprises forming a fin between the substrate and the channel stack.

* * * * *